(12) United States Patent
Kishimoto et al.

(10) Patent No.: US 10,924,080 B2
(45) Date of Patent: Feb. 16, 2021

(54) ACOUSTIC WAVE DEVICE, HIGH FREQUENCY FRONT-END CIRCUIT, AND COMMUNICATION DEVICE

(71) Applicant: Murata Manufacturing Co., Ltd., Nagaokakyo (JP)

(72) Inventors: Yutaka Kishimoto, Nagaokakyo (JP); Masashi Omura, Nagaokakyo (JP); Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/540,143

(22) Filed: Aug. 14, 2019

(65) Prior Publication Data
US 2019/0372547 A1 Dec. 5, 2019

Related U.S. Application Data

(63) Continuation of application No. PCT/JP2017/045987, filed on Dec. 21, 2017.

(30) Foreign Application Priority Data

Feb. 21, 2017 (JP) ................................ 2017-029840

(51) Int. Cl.
*H03H 9/02* (2006.01)
*H03H 9/17* (2006.01)
(Continued)

(52) U.S. Cl.
CPC .............. *H03H 9/0211* (2013.01); *H03F 3/20* (2013.01); *H03H 3/02* (2013.01);
(Continued)

(58) Field of Classification Search
CPC .... H03H 9/0211; H03H 3/02; H03H 9/02228; H03H 9/0561; H03H 2003/025;
(Continued)

(56) References Cited

U.S. PATENT DOCUMENTS

| 10,020,796 B2 * | 7/2018 | Gilbert ..................... H03H 3/08 |
| 2012/0086312 A1 * | 4/2012 | Kobayashi ......... H03H 9/02574 310/348 |

(Continued)

FOREIGN PATENT DOCUMENTS

| JP | 2015-031559 A | 2/2015 |
| JP | 2015-115870 A | 6/2015 |

(Continued)

OTHER PUBLICATIONS

Official Communication issued in International Patent Application No. PCT/JP2017/045987, dated Mar. 20, 2018.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave device includes a supporting substrate, an acoustic reflection film the supporting substrate, a piezoelectric thin film on the acoustic reflection film, and an interdigital transducer electrode the piezoelectric thin film. The acoustic reflection film includes acoustic impedance layers including therein first, second, third, and fourth low acoustic impedance layers and first, second, and third high acoustic impedance layers. The acoustic reflection film includes a first acoustic impedance layer and a second acoustic impedance layer, the first and second acoustic impedance layers each being one of the acoustic impedance layers, and the second acoustic impedance layer has an arithmetic average roughness different from that of the first acoustic impedance layer.

20 Claims, 11 Drawing Sheets

(51) Int. Cl.
  *H03F 3/20* (2006.01)
  *H03H 3/02* (2006.01)
  *H03H 9/05* (2006.01)
  *H04B 1/40* (2015.01)

(52) U.S. Cl.
  CPC ...... *H03H 9/02228* (2013.01); *H03H 9/0561* (2013.01); *H03H 9/175* (2013.01); *H03F 2200/165* (2013.01); *H03F 2200/171* (2013.01); *H03F 2200/451* (2013.01); *H03H 2003/025* (2013.01); *H04B 1/40* (2013.01)

(58) Field of Classification Search
  CPC . H03H 9/02574; H03F 3/20; H03F 2200/165; H03F 2200/171; H03F 2200/451; H03F 2200/111; H03F 3/245; H04B 1/40; H04B 1/0057
  USPC .......................................... 333/133, 193–196
  See application file for complete search history.

(56) References Cited

U.S. PATENT DOCUMENTS

| | | | |
|---|---|---|---|
| 2014/0145558 A1* | 5/2014 | Hori | H03H 9/0595 310/313 R |
| 2014/0152146 A1 | 6/2014 | Kimura et al. | |
| 2017/0366160 A1 | 12/2017 | Kishimoto et al. | |
| 2019/0036009 A1 | 1/2019 | Tai et al. | |

FOREIGN PATENT DOCUMENTS

| | | |
|---|---|---|
| WO | 2012/086441 A1 | 6/2012 |
| WO | 2016/147688 A1 | 9/2016 |
| WO | 2017/163722 A1 | 9/2017 |

\* cited by examiner

S₀ MODE LAMB WAVE

S₁ MODE LAMB WAVE

A₀ MODE LAMB WAVE

A₁ MODE LAMB WAVE

SH₀ MODE

SH₁ MODE

ACOUSTIC WAVE DEVICE, HIGH FREQUENCY FRONT-END CIRCUIT, AND COMMUNICATION DEVICE

CROSS REFERENCE TO RELATED APPLICATIONS

This application claims the benefit of priority to Japanese Patent Application No. 2017-029840 filed on Feb. 21, 2017 and is a Continuation Application of PCT Application No. PCT/JP2017/045987 filed on Dec. 21, 2017. The entire contents of each application are hereby incorporated herein by reference.

BACKGROUND OF THE INVENTION

1. Field of the Invention

The present invention relates to acoustic wave devices, high frequency front-end circuits, and communication devices.

2. Description of the Related Art

In general, acoustic wave devices are widely used in cellular phones and the like. In an acoustic wave device described in International Publication No. 2012/086441, an acoustic reflection layer is provided on a supporting substrate, a piezoelectric layer is provided on the acoustic reflection layer, and an interdigital transducer electrode is provided on the piezoelectric layer. In the acoustic reflection layer, a low acoustic impedance layer and a high acoustic impedance layer are stacked on top of each other.

In the acoustic wave device described in International Publication No. 2012/086441, various unwanted waves are generated sometimes. Accordingly, impedance characteristics and the like are degraded sometimes.

SUMMARY OF THE INVENTION

Preferred embodiments of the present invention provide acoustic wave devices, high frequency front-end circuits, and communication devices, which are each capable of effectively reducing or preventing unwanted waves.

An acoustic wave device according to a preferred embodiment of the present invention includes a supporting substrate, an acoustic reflection film provided on the supporting substrate, a piezoelectric body provided on the acoustic reflection film, and an interdigital transducer electrode provided on the piezoelectric body, wherein the acoustic reflection film is a multilayer body including a plurality of acoustic impedance layers including a low acoustic impedance layer whose acoustic impedance is relatively low and a high acoustic impedance layer whose acoustic impedance is relatively high, and the acoustic reflection film includes a first acoustic impedance layer and a second acoustic impedance layer, the first acoustic impedance layer being one of the plurality of acoustic impedance layers, the second acoustic impedance layer being one of the plurality of acoustic impedance layers and having an arithmetic average roughness (Ra) different from an arithmetic average roughness (Ra) of the first acoustic impedance layer.

In an acoustic wave device according to a preferred embodiment of the present invention, the first acoustic impedance layer is positioned closer to the piezoelectric body than the second acoustic impedance layer, and the arithmetic average roughness (Ra) of the second acoustic impedance layer is larger than the arithmetic average roughness (Ra) of the first acoustic impedance layer. In this case, the unwanted waves likely to pass and propagate through the acoustic reflection film are able to be effectively reduced or prevented.

In an acoustic wave device according to a preferred embodiment of the present invention, the first acoustic impedance layer is positioned closer to the piezoelectric body than the second acoustic impedance layer, and the arithmetic average roughness (Ra) of the first acoustic impedance layer is larger than the arithmetic average roughness (Ra) of the second acoustic impedance layer. In this case, unwanted waves likely to be reflected by the acoustic reflection film are able to be effectively reduced or prevented.

In an acoustic wave device according to a preferred embodiment of the present invention, the acoustic reflection film includes a plurality of the low acoustic impedance layers and a plurality of the high acoustic impedance layers, the low acoustic impedance layers and the high acoustic impedance layers being stacked on top of one another in an alternating arrangement, the first acoustic impedance layer and the second acoustic impedance layer are each the low acoustic impedance layer, and in the plurality of the low acoustic impedance layers, the arithmetic average roughness (Ra) increases as a position of the low acoustic impedance layer is closer to the supporting substrate. In this case, the unwanted waves likely to pass and propagate through the acoustic reflection film are able to be further reduced or prevented.

In an acoustic wave device according to a preferred embodiment of the present invention, the acoustic reflection film includes a plurality of the low acoustic impedance layers and a plurality of the high acoustic impedance layers, the low acoustic impedance layers and the high acoustic impedance layers being stacked on top of one another in an alternating arrangement, the first acoustic impedance layer and the second acoustic impedance layer are each the high acoustic impedance layer, and in the plurality of the high acoustic impedance layers, the arithmetic average roughness (Ra) increases as a position of the high acoustic impedance layer is closer to the supporting substrate. In this case, the unwanted waves likely to pass and propagate through the acoustic reflection film are able to be further reduced or prevented.

In an acoustic wave device according to a preferred embodiment of the present invention, the acoustic reflection film includes a plurality of the low acoustic impedance layers and a plurality of the high acoustic impedance layers, the low acoustic impedance layers and the high acoustic impedance layers being stacked on top of one another in an alternating arrangement, the first acoustic impedance layer and the second acoustic impedance layer are each the low acoustic impedance layer, and in the plurality of the low acoustic impedance layers, the arithmetic average roughness (Ra) increases as a position of the low acoustic impedance layer is closer to the piezoelectric body. In this case, unwanted waves likely to be reflected by the acoustic reflection film are able to further reduced or prevented.

In an acoustic wave device according to a preferred embodiment of the present invention, the acoustic reflection film includes a plurality of the low acoustic impedance layers and a plurality of the high acoustic impedance layers, the low acoustic impedance layers and the high acoustic impedance layers being stacked on top of one another in an alternating arrangement, the first acoustic impedance layer and the second acoustic impedance layer are each the high acoustic impedance layer, and in the plurality of the high acoustic impedance layers, the arithmetic average roughness (Ra) increases as a position of the high acoustic impedance layer is closer to the piezoelectric body. In this case, unwanted waves likely to be reflected by the acoustic reflection film are able to be further reduced or prevented.

In an acoustic wave device according to a preferred embodiment of the present invention, in the acoustic reflection film, a total of five or more layers including one or more low acoustic impedance layers and one or more high acoustic impedance layers are stacked on top of one another in an alternating arrangement. In this case, energy of an acoustic wave being used is able to be effectively confined on a piezoelectric body side.

In an acoustic wave device according to a preferred embodiment of the present invention, a metal film is provided on a surface on an acoustic reflection film side of the piezoelectric body, and the metal film is surrounded by a member made of a dielectric. In this case, the film thickness of the piezoelectric body is able to be easily measured with high accuracy.

In an acoustic wave device according to a preferred embodiment of the present invention, the member made of a dielectric is the acoustic impedance layer of the acoustic reflection film positioned closest to the piezoelectric body. In this case, the film thickness of the piezoelectric body is able to be more easily measured with high accuracy.

In an acoustic wave device according to a preferred embodiment of the present invention, in plan view, the metal film is disposed at a position where the metal film does not overlap the interdigital transducer electrode. In this case, even after the formation of the interdigital transducer electrode, the film thickness of the piezoelectric body is able to be easily measured with high accuracy. The film thickness of the piezoelectric body is able to be measured even after the measurement of electrical characteristics of the interdigital transducer electrode and the like.

In an acoustic wave device according to a preferred embodiment of the present invention, the metal film includes at least one of Ti and Cr. In this case, adhesion between the metal film and the piezoelectric body and between the metal film and the acoustic reflection film is improved. Accordingly, the piezoelectric body and the acoustic reflection film are difficult to separate from each other.

In an acoustic wave device according to a preferred embodiment of the present invention, a plate wave is used. In this case, a particularly effective reduction or prevention of unwanted waves is able to be achieved.

In an acoustic wave device according to a preferred embodiment of the present invention, a film thickness of the piezoelectric body is about 1 μm or less. In this case, a plate wave is able to be suitably excited.

A high frequency front-end circuit according to a preferred embodiment of the present invention includes an acoustic wave device according to a preferred embodiment of the present invention and a power amplifier.

A communication device according to a preferred embodiment of the present invention includes a high frequency front-end circuit according to a preferred embodiment of the present invention and a RF signal processing circuit.

Preferred embodiments of the present invention provide acoustic wave devices, high frequency front-end circuits, and communication devices, which are each capable of effectively reducing or preventing unwanted waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings.

It is noted that each preferred embodiment described in the present specification is for illustrative purposes only and elements and features of different preferred embodiments may be partially exchanged or combined.

Figure 1:
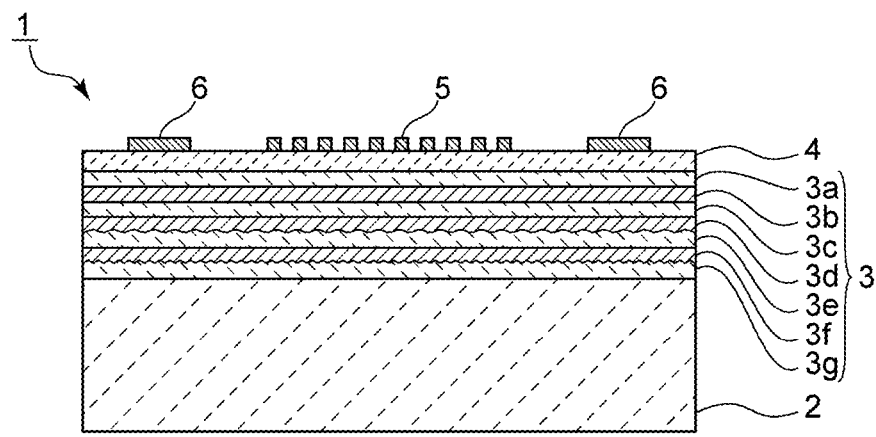
FIG. 1 is a schematic elevational cross-sectional view of an acoustic wave device according to a first preferred embodiment of the present invention.
Figure 2A:
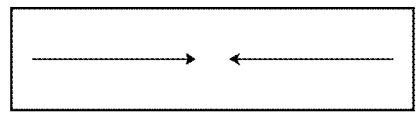
FIGS. 2A to 2F are diagrams illustrating examples of propagation mode of a plate wave.
Figure 2B:
Figure 2C:
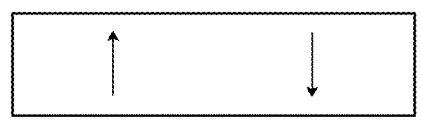
Figure 2D:
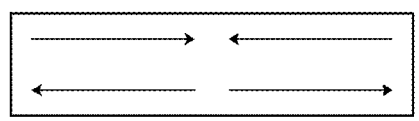
Figure 2E:
Figure 2F:

FIG. 1 is a schematic elevational cross-sectional view of an acoustic wave device according to a first preferred embodiment of the present invention.

An acoustic wave device 1 includes a supporting substrate 2. In the present preferred embodiment, the supporting substrate 2 is preferably made of, for example, Si. Note that the material of the supporting substrate 2 is not limited to the above, and the supporting substrate 2 may be, for example, made of sapphire or glass.

On the supporting substrate 2, an acoustic reflection film 3 is provided. The acoustic reflection film 3 is preferably a multilayer body including a plurality of acoustic impedance layers that are stacked on top of each other. Specifically, the acoustic reflection film 3 includes, as a plurality of low acoustic impedance layers whose acoustic impedances are relatively low, a first low acoustic impedance layer 3a, a second low acoustic impedance layer 3c, a third low acoustic impedance layer 3e, and a fourth low acoustic impedance layer 3g. The acoustic reflection film 3 further includes, as a plurality of high acoustic impedance layers whose acoustic impedances are relatively high, a first high acoustic impedance layer 3b, a second high acoustic impedance layer 3d, and a third high acoustic impedance layer 3f.

In the acoustic wave device 1, the low acoustic impedance layers and the high acoustic impedance layers are stacked on top of each other in an alternating arrangement. Note that the low acoustic impedance layers and the high acoustic impedance layers are not necessarily stacked in an alternating arrangement. In the present preferred embodiment, the total of 7 layers of the acoustic impedance layers are preferably stacked in the acoustic reflection film 3. Note that the number of layers of the acoustic impedance layers in the acoustic reflection film 3 is not limited to the above.

A piezoelectric thin film 4 exemplifying a piezoelectric body is provided on the first low acoustic impedance layer 3a of the acoustic reflection film 3. The piezoelectric thin film 4 is preferably made of, for example, a piezoelectric single crystal such as $LiNbO_3$, $LiTaO_3$, or the like, or any appropriate piezoelectric ceramics. Note that the acoustic impedance layer of the acoustic reflection film 3 positioned closest to the piezoelectric thin film 4 may alternatively be a high acoustic impedance layer.

In the present preferred embodiment, the first high acoustic impedance layer 3b is a first acoustic impedance layer. The second high acoustic impedance layer 3d and the third high acoustic impedance layer 3f are a second acoustic impedance layer and a third acoustic impedance layer, respectively. The second high acoustic impedance layer 3d is positioned closer to the piezoelectric thin film 4 than the third high acoustic impedance layer 3f, and the first high acoustic impedance layer 3b is positioned closer to the piezoelectric thin film 4 than the second high acoustic impedance layer 3d.

Note that the first acoustic impedance layer, the second acoustic impedance layer, and the third acoustic impedance layer only need to be arranged in this order close to the piezoelectric thin film. For example, the first low acoustic impedance layer 3a may be the first acoustic impedance layer, and the first high acoustic impedance layer 3b may be the second acoustic impedance layer.

As schematically illustrated in FIG. 1, the arithmetic average roughness (Ra) of a surface on the supporting substrate 2 side of the third high acoustic impedance layer 3f is larger than the arithmetic average roughness (Ra) of a surface on the supporting substrate 2 side of the second high acoustic impedance layer 3d. The arithmetic average roughness (Ra) of a surface on the supporting substrate 2 side of the second high acoustic impedance layer 3d is larger than the arithmetic average roughness (Ra) of a surface on the supporting substrate 2 side of the first high acoustic impedance layer 3b. In this way, in the first high acoustic impedance layer 3b, the second high acoustic impedance layer 3d, and the third high acoustic impedance layer 3f, the arithmetic average roughness (Ra) of the surface on the supporting substrate 2 side increases as the position of the layer is closer to the supporting substrate 2.

Here, the arithmetic average roughness (Ra) in the present specification corresponds to arithmetic average roughness (Ra) specified in JIS B 0601:2013.

In the present preferred embodiment, the arithmetic average roughness (Ra) of the surface on the supporting substrate 2 side of the third high acoustic impedance layer 3f is preferably about 3.5 nm, for example. The arithmetic average roughness (Ra) of the surface on the supporting substrate 2 side of the second high acoustic impedance layer 3d is preferably about 2.5 nm, for example. The arithmetic average roughness (Ra) of the surface on the supporting substrate 2 side of the first high acoustic impedance layer 3b is preferably about 0 nm, for example.

Note that the first acoustic impedance layer, the second acoustic impedance layer, and the third acoustic impedance layer may have the foregoing relationship in the arithmetic average roughness (Ra) of the surface on the piezoelectric thin film 4 side. The value of the arithmetic average roughness (Ra) of each acoustic impedance layer is not limited to the above.

On the other hand, in the present preferred embodiment, the first low acoustic impedance layer 3a, the second low acoustic impedance layer 3c, the third low acoustic impedance layer 3e, and the fourth low acoustic impedance layer 3g preferably have the same or substantially the same arithmetic average roughness (Ra).

In the acoustic wave device 1, the first low acoustic impedance layer 3a, the second low acoustic impedance layer 3c, the third low acoustic impedance layer 3e, and the fourth low acoustic impedance layer 3g are preferably made of, for example, $SiO_2$. Note that the material of each low acoustic impedance layer is not limited to the above, and any appropriate material having relatively low acoustic impedance may be used. In the case where a plurality of low acoustic impedance layers are included, each low acoustic impedance layer may alternatively be made of a different material.

The first high acoustic impedance layer 3b, the second high acoustic impedance layer 3d, and the third high acoustic impedance layer 3f are preferably made of, for example, Pt. The material of each high acoustic impedance layer is not limited to the above, and any appropriate material having relatively high acoustic impedance may be used. In addition to Pt, as the material of each high acoustic impedance layer, for example, SiN, AlN, $TiO_2$, $Al_2O_3$, $Ta_2O_5$, W, Sn, and the like may be used. In the case where a plurality of high acoustic impedance layers are included, each high acoustic impedance layer may be made of a different material.

As illustrated in FIG. 1, an interdigital transducer electrode 5 and wiring 6 are provided on the piezoelectric thin film 4. The interdigital transducer electrode 5 and the wiring 6 are electrically connected. The interdigital transducer electrode 5 preferably includes a multilayer metal film in which, for example, a Ti layer and an AlCu layer are stacked in this order from the piezoelectric thin film 4 side. In the present preferred embodiment, the AlCu layer preferably contains about 1 weight percent of Cu, for example. On the other hand, the wiring 6 preferably includes a multilayer metal film in which, for example, a Ti layer and an Al layer are stacked in this order from the piezoelectric thin film 4 side. Note that the materials of the interdigital transducer electrode 5 and the wiring 6 are not limited to the above. The interdigital transducer electrode 5 and the wiring 6 may include a single layer of a metal film.

An acoustic wave is excited by applying an alternating-current voltage to the interdigital transducer electrode 5. An acoustic wave device 1 uses a plate wave as an acoustic wave. Because the acoustic wave being used is reflected by the acoustic reflection film 3, energy of the acoustic wave being used is able to be effectively confined on the piezoelectric thin film 4 side.

Note that the plate wave is a collective name for various waves excited in the piezoelectric thin film having a film thickness of about 1λ or less where λ is a wavelength to be excited and the film thickness is normalized by the wavelength λ.

As in the present preferred embodiment, it is preferable that the total of 5 or more layers of the low acoustic impedance layers and the high acoustic impedance layers are stacked in an alternating arrangement. This enables the energy of the acoustic wave being used to be more effectively confined on the piezoelectric thin film 4 side.

Acoustic wave devices using the plate waves are prone to generate various unwanted waves. Although the details will be described later, preferred embodiments of the present invention enable the reduction or prevention of respective unwanted waves depending on the usage. Therefore, preferred embodiments of the present invention are particularly suitable for the acoustic wave devices that use plate waves.

In the present preferred embodiment, the first low acoustic impedance layer 3a, the second low acoustic impedance layer 3c, the third low acoustic impedance layer 3e, and the fourth low acoustic impedance layer 3g each preferably have a film thickness, for example, between about 10 nm and about 1000 nm inclusive. The first high acoustic impedance layer 3b, the second high acoustic impedance layer 3d, and the third high acoustic impedance layer 3f each preferably have a film thickness, for example, between about 10 nm and about 1000 nm inclusive. The film thickness of the piezoelectric thin film 4 is preferably about 1 μm or less, for example. Setting the film thickness of the piezoelectric thin film 4 within the foregoing range enables it to suitably excite a plate wave. The film thickness of the interdigital transducer electrode 5 is preferably, for example, between about 10 nm and about 1000 nm inclusive. The film thickness of the wiring 6 is preferably, for example, between about 100 nm and about 2000 nm inclusive. Note that the film thicknesses of each low acoustic impedance layer, each high acoustic impedance layer, the piezoelectric thin film 4, and the wiring 6 are not limited to the above.

The acoustic wave device 1 of the present preferred embodiment has a configuration such that the acoustic wave device 1 includes the supporting substrate 2, the acoustic reflection film 3 provided on the supporting substrate 2, the piezoelectric thin film 4 provided on the acoustic reflection film 3, and the interdigital transducer electrode 5 provided on the piezoelectric thin film 4, wherein the acoustic reflection film 3 includes a first acoustic impedance layer and a second acoustic impedance layer, the first acoustic impedance layer being one of a plurality of acoustic impedance layers, the second acoustic impedance layer being one of the plurality of acoustic impedance layers and having an arithmetic average roughness (Ra) different from that of the first acoustic impedance layer. A main mode of a plate wave of the present preferred embodiment is confined in the acoustic reflection film on the side close to the piezoelectric thin film, and generally, a wave penetrating through the acoustic reflection film (namely, a wave that reaches to the side close to the supporting substrate) is an unwanted wave. Accordingly, by having this configuration, effects of the unwanted waves are able to b effectively reduced or prevented while maintaining characteristics of the main mode. This is described below. Note that, in the present specification, the main mode means a mode of an acoustic wave being used.

In the present preferred embodiment, a plate wave of $S_0$ mode, for example, is preferably used. Here, the plate wave of $S_0$ mode is a collective name for waves whose main component of displacement is a longitudinal wave and excited in the piezoelectric thin film having a film thickness of about 1λ or less where λ is the wavelength of a plate wave to be excited and the film thickness is normalized by the wavelength λ. Note that a plate wave having a mode other than $S_0$ mode may also be used. For example, a plate wave of $A_1$ mode or $SH_0$ mode may also be used.

FIGS. 2A to 2F are diagrams illustrating examples of the propagation mode of a plate wave. In FIGS. 2A to 2D, the direction of arrow denotes the displacement direction of an acoustic wave, and in FIGS. 2E and FIG. 2F, the thickness direction of a page denotes the displacement direction of an acoustic wave.

Depending on the displacement component, plate waves are classified into a Lamb wave (a component in the acoustic wave propagation direction and the thickness direction of a piezoelectric body is main) and an SH (Shear Horizontal)

wave (an SH component is main). Further, Lamb waves are classified into a symmetrical mode (S mode) and an antisymmetric mode (A mode). Note that when folded back at the median line in the thickness direction of a piezoelectric body, the symmetric mode is a mode in which displacements overlap, and the antisymmetric mode is a mode in which displacements are in opposite directions. The subscript number in the mode name indicates the number of nodes in the thickness direction. For example, an $A_1$ mode Lamb wave is a 1st-order antisymmetric mode Lamb wave.

In the present preferred embodiment, a plate wave of $S_0$ mode, which is being used, is confined near the piezoelectric thin film 4 illustrated in FIG. 1. On the other hand, in addition to the plate wave of $S_0$ mode, unwanted waves that are likely to pass and propagate through the acoustic reflection film 3 are also excited. Such unwanted waves propagate through the acoustic reflection film 3 and reach the supporting substrate 2. In the present preferred embodiment, the acoustic reflection film 3 includes at least two acoustic impedance layers having different arithmetic average roughnesses (Ra). This enables scattering of the unwanted waves. Further, in the present preferred embodiment, in the first high acoustic impedance layer 3b, the second high acoustic impedance layer 3d, and the third high acoustic impedance layer 3f, the arithmetic average roughness (Ra) increases as the position of the layer is closer to the supporting substrate 2. This enables efficient scattering of the unwanted waves. Accordingly, the unwanted waves are able to be effectively reduced or prevented.

In the following, advantageous effects of the first preferred embodiment are specifically illustrated by comparing the first preferred embodiment with a first comparison example. Note that the first comparison example is different from the first preferred embodiment in that the arithmetic average roughnesses (Ra) of the first high acoustic impedance layer, the second high acoustic impedance layer, and the third high acoustic impedance layer are 0 nm.

Figure 3:
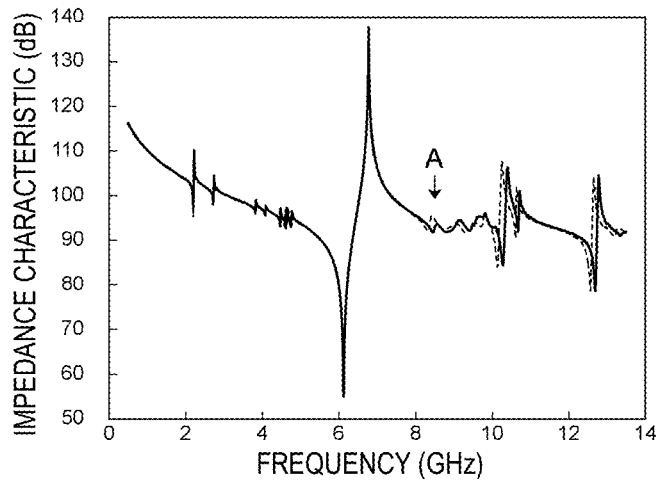
FIG. 3 is a diagram illustrating impedance characteristics in the first preferred embodiment of the present invention and a first comparison example.

FIG. 3 is a diagram illustrating impedance characteristics in the first preferred embodiment and the first comparison example. In FIG. 3, the solid line denotes a result of the first preferred embodiment, and the dashed line denotes a result of the first comparison example.

As illustrated in FIG. 3, it is seen that an unwanted wave denoted by the arrow A is reduced in the first preferred embodiment compared to the first comparison example. In this way, in the first preferred embodiment, the unwanted waves likely to pass and propagate through the acoustic reflection film 3 are able to be effectively reduced or prevented.

Note that, due to effects of the foregoing unwanted waves, impedance characteristics and the like may sometimes degrade. The first preferred embodiment enables the reduction or prevention of the unwanted waves, and thus the degradation of impedance characteristics and the like hardly occur.

In addition, in a plurality of high acoustic impedance layers, the arithmetic average roughness (Ra) decreases as the position of the high acoustic impedance layer is closer to the piezoelectric thin film 4. Accordingly, the acoustic wave being used is unlikely to be scattered. Accordingly, the first preferred embodiment enables effective reduction or prevention of the unwanted waves and effectively confine energy of an acoustic wave being used.

Incidentally, in a plurality of high acoustic impedance layers, the arithmetic average roughness (Ra) may be the same, and further, in a plurality of low acoustic impedance layers, the arithmetic average roughness (Ra) may increase as the position of the low acoustic impedance layer is closer to a supporting substrate. Even in this case, the unwanted waves likely to pass and propagate through the acoustic reflection film are able to be efficiently scattered. Accordingly, the unwanted waves are able to be effectively reduced or prevented. Note that, in this case, for example, the first low acoustic impedance layer is the first acoustic impedance layer, and the second low acoustic impedance layer is the second acoustic impedance layer.

Alternatively, in the plurality of low acoustic impedance layers, the arithmetic average roughness (Ra) may increase as the position of the low acoustic impedance layer is closer to the supporting substrate, and further in the plurality of high acoustic impedance layers, the arithmetic average roughness (Ra) may increase as the position of the high acoustic impedance layer is closer to the supporting substrate. Similarly, even in this case, the unwanted waves are able to be efficiently scattered.

Referring back to FIG. 1, the number of layers of the acoustic impedance layers in the acoustic reflection film 3 is not particularly limited. It only needs to have a larger arithmetic average roughness (Ra) in the second high acoustic impedance layer 3d, which defines and functions as the second acoustic impedance layer, than the arithmetic average roughness (Ra) of the first high acoustic impedance layer 3b, which defines and functions as the first acoustic impedance layer. An example of such a case is described in the following modified example of the first preferred embodiment.

Figure 4:
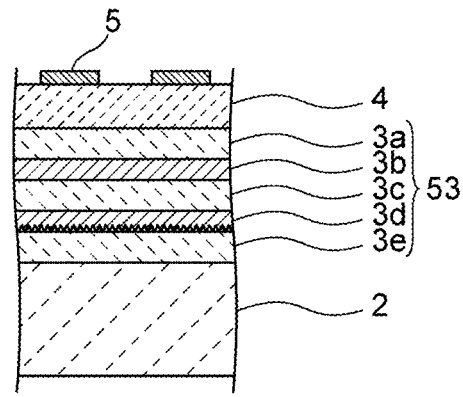
FIG. 4 is a schematic enlarged elevational cross-sectional view of an acoustic wave device according to a modified example of the first preferred embodiment of the present invention.

FIG. 4 is a schematic enlarged elevational cross-sectional view of an acoustic wave device according to a modified example of the first preferred embodiment.

The present modified example is different from the first preferred embodiment in that an acoustic reflection film 53 does not include the third high acoustic impedance layer, which defines and functions as the third acoustic impedance layer, and the fourth low acoustic impedance layer. As with the first preferred embodiment, the arithmetic average roughness (Ra) of the first high acoustic impedance layer 3b is preferably about 0 nm, and the arithmetic average roughness (Ra) of the second high acoustic impedance layer 3d is preferably about 2.5 nm, for example.

Figure 5:
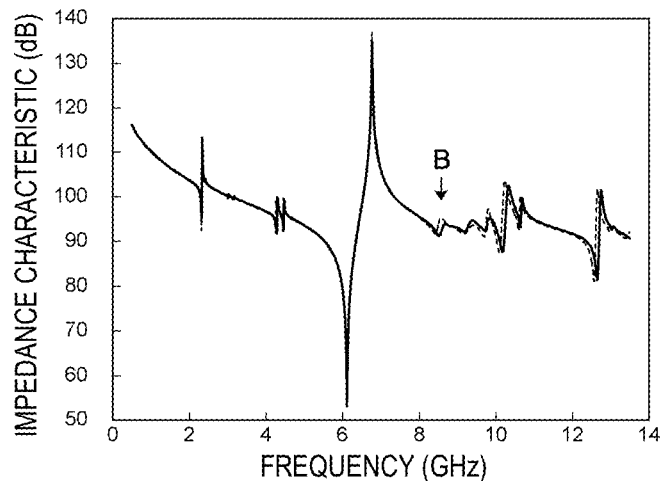
FIG. 5 is a diagram illustrating impedance characteristics in the modified example of the first preferred embodiment of the present invention and a second comparison example.

FIG. 5 is a diagram illustrating impedance characteristics in the modified example of the first preferred embodiment and a second comparison example. In FIG. 5, the solid line denotes a result of the modified example of the first preferred embodiment, and the dashed line denotes a result of a second comparison example. Note that the second comparison example is different from the modified example of the first preferred embodiment in that the arithmetic average roughnesses (Ra) of the first high acoustic impedance layer and the second high acoustic impedance layer are 0 nm.

As illustrated in FIG. 5, it is seen that an unwanted wave denoted by the arrow B is reduced in the modified example of the first preferred embodiment compared to the second comparison example. In this way, even in the modified example of the first preferred embodiment, the unwanted waves are able to be effectively reduced or prevented.

In the present modified example, a material combination of a plurality of the low acoustic impedance layers and a plurality of the high acoustic impedance layers preferably includes, for example, from the piezoelectric thin film 4 side, a $SiO_2$ layer, a Pt layer, a $SiO_2$ layer, a Pt layer, and a $SiO_2$ layer. Note that the material combination of a plurality of the low acoustic impedance layers and a plurality of the high acoustic impedance layers is not limited to the above and may alternatively include, for example, a $SiO_2$ layer, a W layer, a $SiO_2$ layer, a $Ta_2O_5$ layer, and a $SiO_2$ layer, or any other similar combinations.

In acoustic wave devices, different unwanted waves are sometimes excited, which are different from the unwanted waves that pass through the acoustic reflection film and propagate to the supporting substrate. For example, unwanted waves that are likely to be reflected by the acoustic reflection film and confined on the piezoelectric thin film side are sometimes excited. Such unwanted waves are able to be reduced or prevented by a second preferred embodiment of the present invention, which will be described below.

Figure 6:
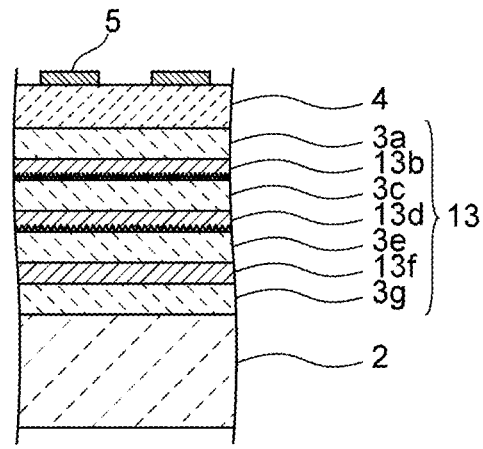
FIG. 6 is a schematic enlarged elevational cross-sectional view of an acoustic wave device according to a second preferred embodiment of the present invention.

FIG. 6 is a schematic enlarged elevational cross-sectional view of an acoustic wave device according to the second preferred embodiment.

The second preferred embodiment is different from the first preferred embodiment in the relationship among the arithmetic average roughnesses (Ra) of the first high acoustic impedance layer 13b, the second high acoustic impedance layer 13d, and the third high acoustic impedance layer 13f. With regard to points other than the above, the acoustic wave device of the second preferred embodiment has a configuration similar to that of the acoustic wave device 1 of the first preferred embodiment.

More specifically, in the first high acoustic impedance layer 13b, the second high acoustic impedance layer 13d, and the third high acoustic impedance layer 13f, the arithmetic average roughness (Ra) increases as the position of the layer is closer to the piezoelectric thin film 4. The arithmetic average roughness (Ra) of the first high acoustic impedance layer 13b is preferably about 3.5 nm, for example. The arithmetic average roughness (Ra) of the second high acoustic impedance layer 13d is preferably about 2.5 nm, for example. The arithmetic average roughness (Ra) of the third high acoustic impedance layer 13f is preferably about 0 nm, for example. In this way, in the present preferred embodiment, the arithmetic average roughness (Ra) of the first high acoustic impedance layer 13b, which defines and functions as the first acoustic impedance layer, is larger than the arithmetic average roughness (Ra) of the second high acoustic impedance layer 13d, which defines and functions as the second acoustic impedance layer.

In the present preferred embodiment, by having the above configuration, the unwanted waves likely to be reflected by the acoustic reflection film 13 are able to be efficiently scattered. This enables the effective reduction or prevention of the unwanted waves.

In the following, advantageous effects of the present preferred embodiment are specifically described by comparing the present preferred embodiment with a third comparison example. Note that the third comparison example is different from the present preferred embodiment in that the arithmetic average roughnesses (Ra) of the first high acoustic impedance layer, the second high acoustic impedance layer, and the third high acoustic impedance layer are 0 nm.

Figure 7:
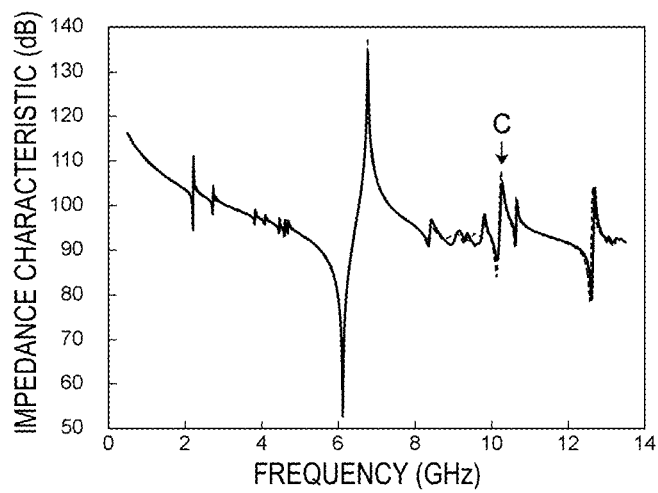
FIG. 7 is a diagram illustrating impedance characteristics in the second preferred embodiment of the present invention and a third comparison example.
Figure 8:
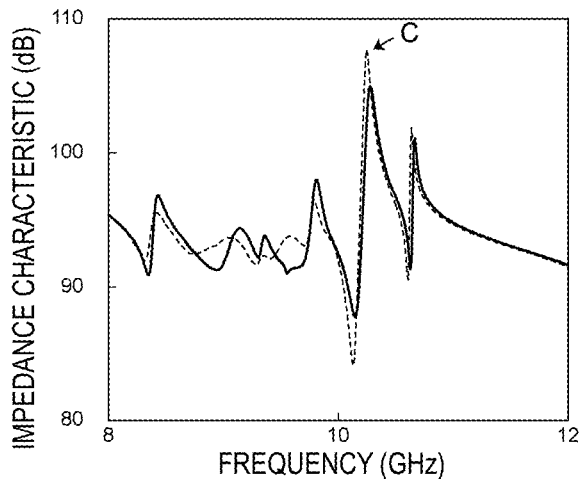
FIG. 8 is an enlarged view of FIG. 7.

FIG. 7 is a diagram illustrating impedance characteristics in the second preferred embodiment and the third comparison example. FIG. 8 is an enlarged view of FIG. 7. In FIG. 7 and FIG. 8, the solid line denotes a result of the second preferred embodiment, and the dashed line denotes a result of the third comparison example.

As illustrated in FIG. 7 and FIG. 8, it is discovered that an unwanted wave denoted by the arrow C is reduced in the second preferred embodiment compared to the third comparison example. In this way, even in the second preferred embodiment, the unwanted waves are able to be effectively reduced or prevented.

As in the present preferred embodiment, even in the configuration in which the arithmetic average roughness (Ra) of the first acoustic impedance layer is larger than the arithmetic average roughness (Ra) of the second acoustic impedance layer, the number of layers of the acoustic impedance layers in the acoustic reflection film is not particularly limited.

Figure 9:
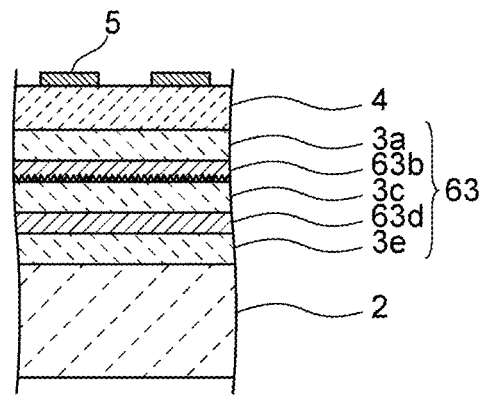
FIG. 9 is a schematic enlarged elevational cross-sectional view of an acoustic wave device according to a modified example of the second preferred embodiment of the present invention.

FIG. 9 is a schematic enlarged elevational cross-sectional view of an acoustic wave device according to a modified example of the second preferred embodiment.

The present modified example is different from the second preferred embodiment in that an acoustic reflection film 63 does not include the third high acoustic impedance layer, which defines and functions as the third acoustic impedance layer, and the fourth low acoustic impedance layer. Note that the arithmetic average roughness (Ra) of a first high acoustic impedance layer 63b is preferably about 2.5 nm, and the arithmetic average roughness (Ra) of a second high acoustic impedance layer 63d is preferably about 0 nm, for example.

Figure 10:
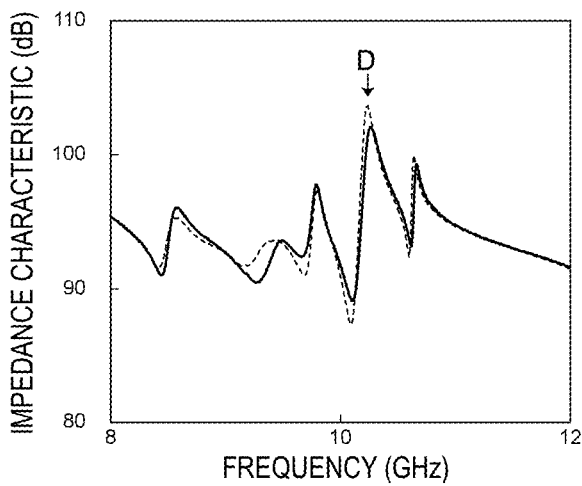
FIG. 10 is a diagram illustrating impedance characteristics near a frequency band where an unwanted wave is generated in the modified example of the second preferred embodiment of the present invention and a fourth comparison example.
Figure 11:
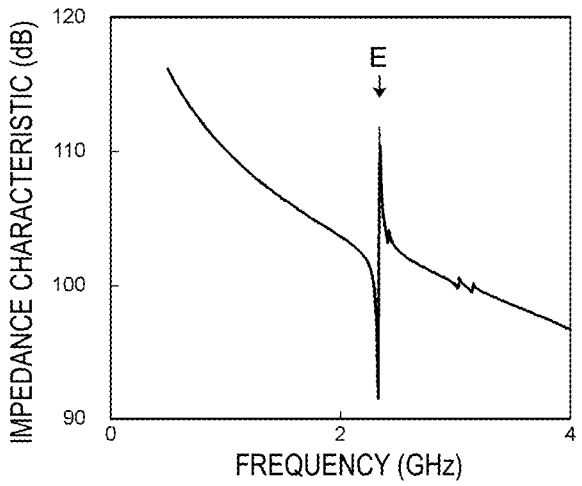
FIG. 11 is a diagram illustrating impedance characteristics near a frequency band where an unwanted wave is generated in the modified example of the second preferred embodiment of the present invention and a fourth comparison example.

FIG. 10 is a diagram illustrating impedance characteristics near a frequency band where an unwanted wave is generated in the modified example of the second preferred embodiment and a fourth comparison example. FIG. 11 is a diagram illustrating impedance characteristics near a frequency band where an unwanted wave is generated in the modified example of the second preferred embodiment and the fourth comparison example. In the FIG. 10 and FIG. 11, the solid line denotes a result of the modified example of the second preferred embodiment, and the dashed line denotes a result of the fourth comparison example. Note that the fourth comparison example is different from the modified example of the second preferred embodiment in that the arithmetic average roughnesses (Ra) of the first high acoustic impedance layer and the second high acoustic impedance layer are 0 nm.

As illustrated in FIG. 10 and FIG. 11, it is discovered that unwanted waves denoted by the arrow D and the arrow E are reduced in the modified example of the second preferred embodiment compared to the fourth comparison example. In this way, even in the modified example of the second preferred embodiment, the unwanted waves are able to be effectively reduced or prevented.

Figure 12:
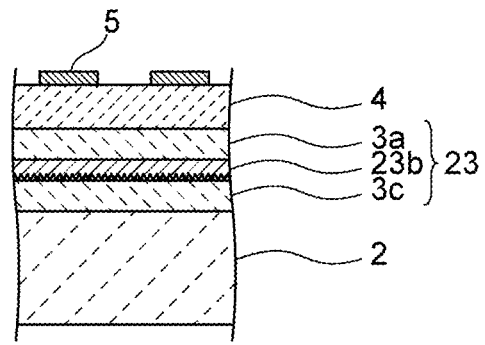
FIG. 12 is a schematic enlarged elevational cross-sectional view of an acoustic wave device according to a third preferred embodiment of the present invention.

FIG. 12 is a schematic enlarged elevational cross-sectional view of an acoustic wave device according to a third preferred embodiment of the present invention.

The present preferred embodiment is different from the first preferred embodiment in that the first acoustic impedance layer is the first low acoustic impedance layer 3a and the second acoustic impedance layer is a first high acoustic impedance layer 23b. The present preferred embodiment is also different from the first preferred embodiment in that the number of layers in an acoustic reflection film 23 is 3 layers. With regard to points other than the above, the acoustic wave device of the present preferred embodiment has a configuration similar to that of the acoustic wave device 1 of the first preferred embodiment. As with the first preferred embodiment, in the present preferred embodiment, the arithmetic average roughness (Ra) of the second acoustic impedance layer is larger than the arithmetic average roughness (Ra) of the first acoustic impedance layer.

More specifically, the acoustic reflection film 23 is a multilayer body including the first low acoustic impedance layer 3a, the first high acoustic impedance layer 23b, and the second low acoustic impedance layer 3c that are stacked on top of each other. The arithmetic average roughness (Ra) of the first low acoustic impedance layer 3a is preferably about 0 nm, for example. The arithmetic average roughness (Ra) of the first high acoustic impedance layer 23b is preferably about 2.5 nm, for example. As with the first preferred embodiment, even in this case, the unwanted waves are able to be efficiently scattered, and the unwanted waves are able to be effectively reduced or prevented.

In the present preferred embodiment, a material combination of a plurality of the low acoustic impedance layers and the high acoustic impedance layer preferably includes, for example, from the piezoelectric thin film 4 side, a $SiO_2$ layer, a Pt layer, and a $SiO_2$ layer. Note that the material combination of a plurality of the low acoustic impedance layers and the high acoustic impedance layer is not limited to the above and may alternatively include, for example, a $SiO_2$ layer, a W layer, and a $SiO_2$ layer, or any other similar combination.

Figure 13:
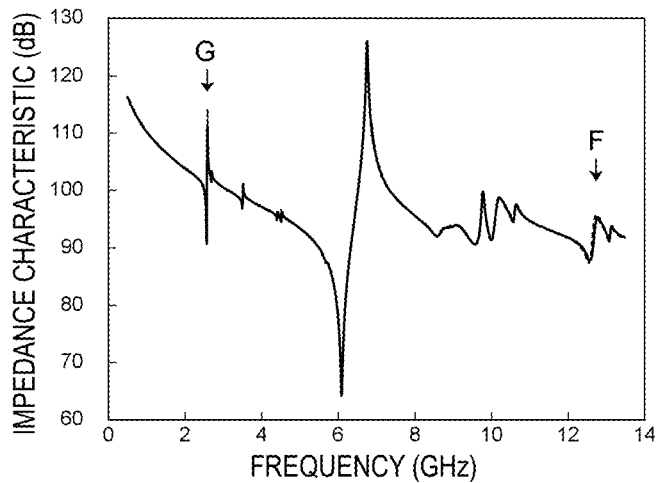
FIG. 13 is a diagram illustrating impedance characteristics in the third preferred embodiment of the present invention and a fifth comparison example.
Figure 14:
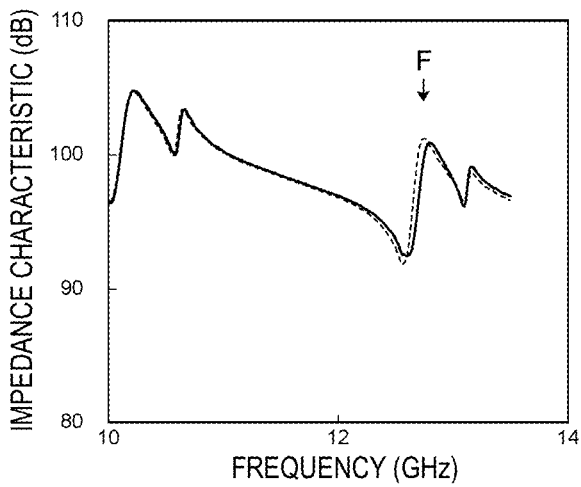
FIG. 14 is an enlarged view of FIG. 13.

FIG. 13 is a diagram illustrating impedance characteristics in the third preferred embodiment and a fifth comparison example. FIG. 14 is an enlarged view of FIG. 13. In FIG. 13 and FIG. 14, the solid line denotes a result of the third preferred embodiment, and the dashed line denotes a result of the fifth comparison example. Note that the fifth comparison example is different from the third preferred embodiment in that the arithmetic average roughnesses (Ra) of the first low acoustic impedance layer and the first high acoustic impedance layer are 0 nm.

As illustrated in FIG. 13 and FIG. 14, it is discovered that unwanted waves denoted by the arrow F and the arrow G are reduced in the third preferred embodiment compared to the fifth comparison example. In this way, even in the third preferred embodiment, the unwanted waves are able to be effectively reduced of prevented.

As in the present preferred embodiment, even in the configuration in which the first acoustic impedance layer is the low acoustic impedance layer and the second acoustic impedance layer is the high acoustic impedance layer, the number of layers of the acoustic impedance layers in the acoustic reflection film is not particularly limited.

Figure 15:
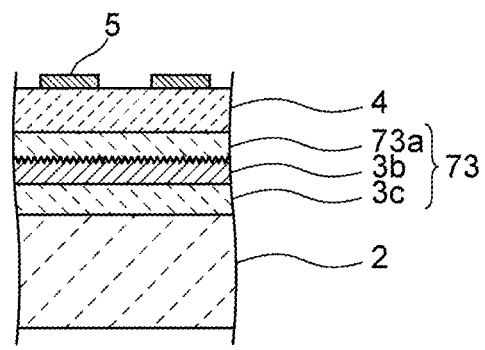
FIG. 15 is a schematic enlarged elevational cross-sectional view of an acoustic wave device according to a first modified example of the third preferred embodiment of the present invention.

FIG. 15 is a schematic enlarged elevational cross-sectional view of an acoustic wave device according to a first modified example of the third preferred embodiment.

The present modified example is different from the third preferred embodiment in that the arithmetic average roughness (Ra) of a first low acoustic impedance layer 73a, which defines and functions as the first acoustic impedance layer, is larger than the arithmetic average roughness (Ra) of the first high acoustic impedance layer 3b, which defines and functions as the second acoustic impedance layer. More specifically, the arithmetic average roughness (Ra) of the first low acoustic impedance layer 73a is preferably about 2.5 nm, for example, and the arithmetic average roughness (Ra) of the first high acoustic impedance layer 3b is preferably about 0 nm, for example.

In the present modified example, the arithmetic average roughness (Ra) of the first low acoustic impedance layer 73a positioned closer to the piezoelectric thin film 4 is larger than the arithmetic average roughness (Ra) of the first high acoustic impedance layer 3b positioned closer to the supporting substrate 2. Accordingly, unwanted waves likely to be reflected by an acoustic reflection film 73 are able to be reduced or prevented.

Figure 16:
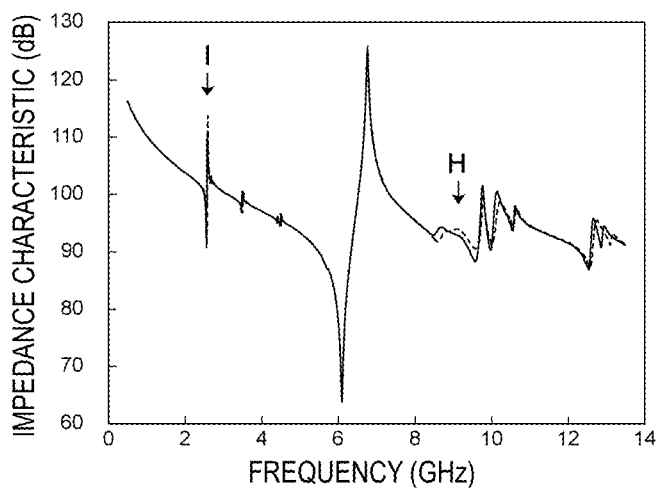
FIG. 16 is a diagram illustrating impedance characteristics in the first modified example of the third preferred embodiment of the present invention and a sixth comparison example.

FIG. 16 is a diagram illustrating impedance characteristics in the first modified example of the third preferred embodiment and a sixth comparison example. In FIG. 16, the solid line denotes a result of the first modified example of the third preferred embodiment, and the dashed line denotes a result of the sixth comparison example. Note that the sixth comparison example is different from the first modified example of the third preferred embodiment in that the arithmetic average roughnesses (Ra) of the first low acoustic impedance layer and the first high acoustic impedance layer are 0 nm.

As illustrated in FIG. 16, it is discovered that unwanted waves denoted by the arrow H and the arrow I are reduced in the first modified example of the third preferred embodiment compared to the sixth comparison example. In this way, even in the first modified example of the third preferred embodiment, the unwanted waves are able to be effectively reduced or prevented.

Figure 17:
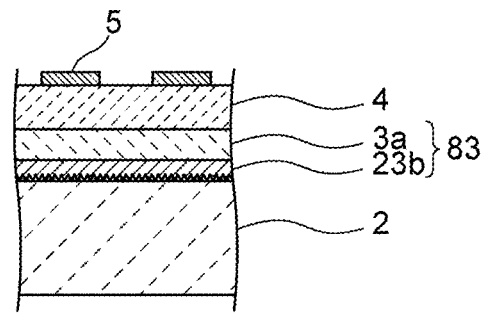
FIG. 17 is a schematic enlarged elevational cross-sectional view of an acoustic wave device according to a second modified example of the third preferred embodiment of the present invention.

FIG. 17 is a schematic enlarged elevational cross-sectional view of an acoustic wave device according to a second modified example of the third preferred embodiment.

The present modified example is different from the third preferred embodiment in that an acoustic reflection film 83 does not include the second low acoustic impedance layer. Note that, as with the third preferred embodiment, the arithmetic average roughness (Ra) of the first low acoustic impedance layer 3a is preferably about 0 nm, for example, and the arithmetic average roughness (Ra) of the first high acoustic impedance layer 23b is preferably about 2.5 nm, for example.

As in the present modified example, from the piezoelectric thin film 4 side, the first low acoustic impedance layer 3a, the first high acoustic impedance layer 23b, and the supporting substrate 2 may be stacked in this order.

Figure 18:
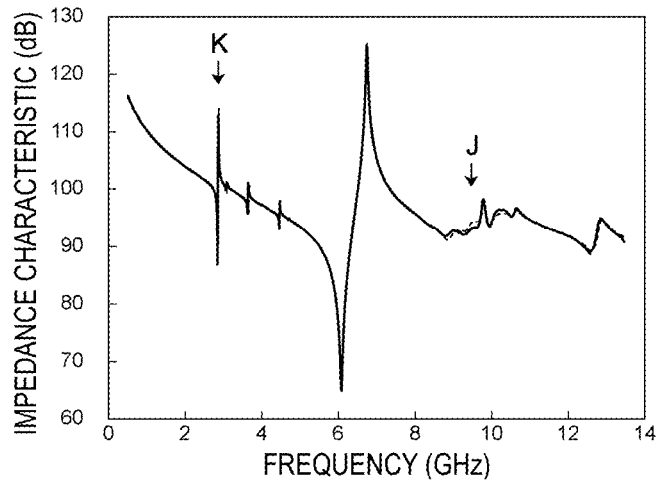
FIG. 18 is a diagram illustrating impedance characteristics in the second modified example of the third preferred embodiment of the present invention and a seventh comparison example.

FIG. 18 is a diagram illustrating impedance characteristics in the second modified example of the third preferred embodiment and a seventh comparison example. In FIG. 18, the solid line denotes a result of the second modified example of the third preferred embodiment, and the dashed line denotes a result of the seventh comparison example. Note that the seventh comparison example is different from the second modified example of the third preferred embodiment in that the arithmetic average roughnesses (Ra) of the first low acoustic impedance layer and the first high acoustic impedance layer are 0 nm.

As illustrated in FIG. 18, it is seen that unwanted waves denoted by the arrow J and the arrow K are reduced in the second modified example of the third preferred embodiment compared to the seventh comparison example. In this way, even in the second modified example of the third preferred embodiment, the unwanted waves are able to be effectively reduced or prevented.

Figure 19:
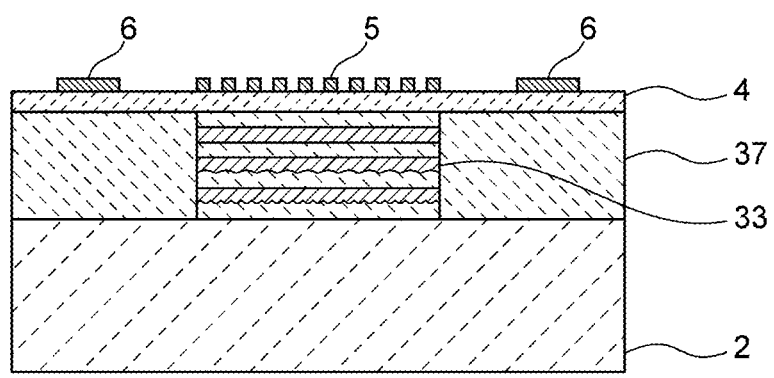
FIG. 19 is a schematic elevational cross-sectional view of an acoustic wave device according to a fourth preferred embodiment of the present invention.

FIG. 19 is a schematic elevational cross-sectional view of an acoustic wave device according to a fourth preferred embodiment of the present invention.

The present preferred embodiment is different from the first preferred embodiment in that, in plan view, an acoustic reflection film 33 is provided on a portion where the acoustic reflection film 33 overlaps the interdigital transducer electrode 5 and a supporting member 37 surrounds the acoustic reflection film 33. With regard to points other than the above, the acoustic wave device of the present preferred embodiment has a configuration similar to that of the acoustic wave device 1 of the first preferred embodiment.

As with the acoustic reflection film 33, the supporting member 37 is positioned between the supporting substrate 2 and the piezoelectric thin film 4. The supporting member 37 is not particularly limited but is preferably made of $SiO_2$, for example, in the present preferred embodiment.

In the present preferred embodiment, each of the high acoustic impedance layers in the acoustic reflection film 33 is preferably a metal layer made of Pt, for example. In this way, the acoustic reflection film 33 includes the metal layers. In plan view, the wiring 6 and the acoustic reflection film 33 do not overlap. Thus, parasitic capacitance is able to be reduced or prevented.

In addition, even in the present preferred embodiment, as with the first preferred embodiment, the unwanted waves are able to be effectively reduced or prevented.

Note that, in plan view, the acoustic reflection film 33 may extend near a portion that overlaps the wiring 6. Even in this case, an overlapping area of the acoustic reflection film 33 and the wiring 6 is able to be reduced. Accordingly, the parasitic capacitance is able to be reduced or prevented.

As described above, the acoustic wave devices that use plate waves, which are described in the first to fourth preferred embodiments and their modified examples, tend to generate various unwanted waves. Preferred embodiments of the present invention enable the effective reduction or prevention of unwanted waves depending on the application.

In the first to fourth preferred embodiments and their modified examples, the piezoelectric body is preferably a piezoelectric thin film. Note that the piezoelectric body may alternatively be, for example, a piezoelectric substrate. Even in this case, the unwanted waves are able to be reduced or prevented.

In the following, a non-limiting example of a fabrication method of an acoustic wave device according to the first preferred embodiment is described.

FIGS. 20A to 20D are schematic elevational cross-sectional views for describing the non-limiting example of a fabrication method of an acoustic wave device according to the first preferred embodiment. FIGS. 21A and 21B are schematic elevational cross-sectional views for describing the non-limiting example of a fabrication method of an acoustic wave device according to the first preferred embodiment.

Figure 20A:
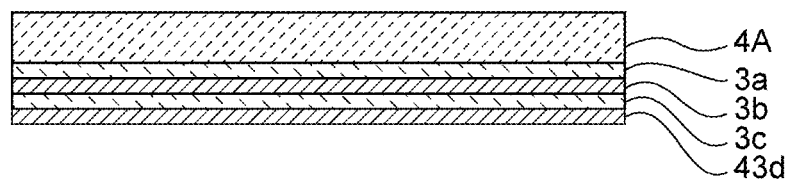
FIGS. 20A to 20D are schematic elevational cross-sectional views for describing an example of a fabrication method of an acoustic wave device according to the first preferred embodiment of the present invention.
Figure 21A:
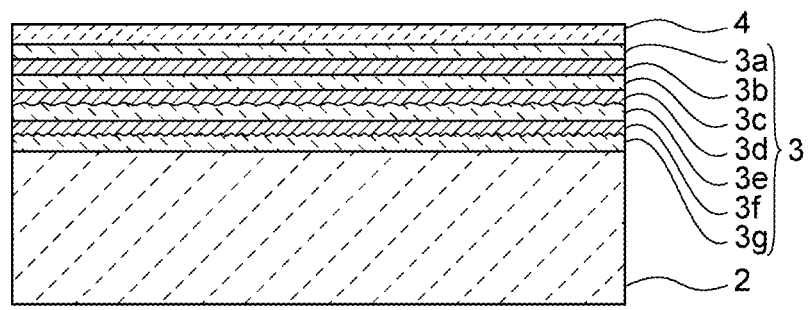
FIGS. 21A and 21B are schematic elevational cross-sectional views for describing the example of a fabrication method of an acoustic wave device according to the first preferred embodiment of the present invention.
Figure 21B:
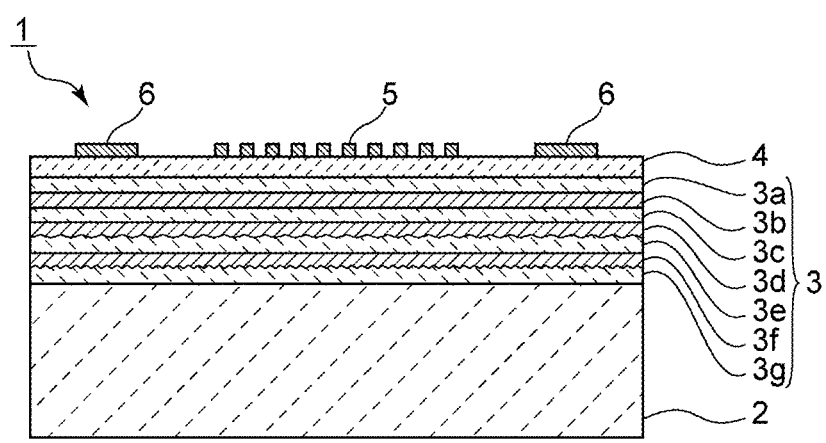

As illustrated in FIG. 20A, a piezoelectric substrate 4A is provided. Next, the first low acoustic impedance layer 3a is formed on the piezoelectric substrate 4A. The first low acoustic impedance layer 3a may be formed, for example, by sputtering or the like. Next, the first high acoustic impedance layer 3b is formed on the first low acoustic impedance layer 3a. The first high acoustic impedance layer 3b may be formed, for example, by sputtering, vapor deposition, or the like. Next, similarly, the second low acoustic impedance layer 3c is stacked on the first high acoustic impedance layer 3b, and a second high acoustic impedance layer 43d is stacked on the second low acoustic impedance layer 3c.

Figure 20B:
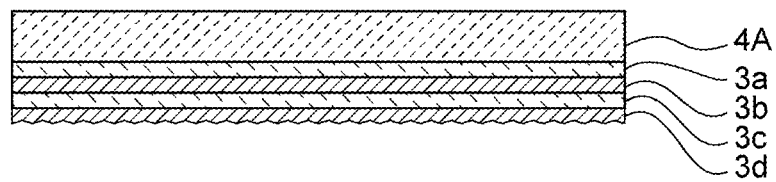

Next, surface roughening is performed on a surface of the second high acoustic impedance layer 43d on the side opposite to the piezoelectric substrate 4A side. The method of surface roughening is not particularly limited but, for example, polishing or the like may be used to roughen the foregoing surface into a rough surface. As illustrated in FIG. 20B, this obtains the second high acoustic impedance layer 3d whose arithmetic average roughness (Ra) is larger than the arithmetic average roughness (Ra) of the first high acoustic impedance layer 3b.

Figure 20C:
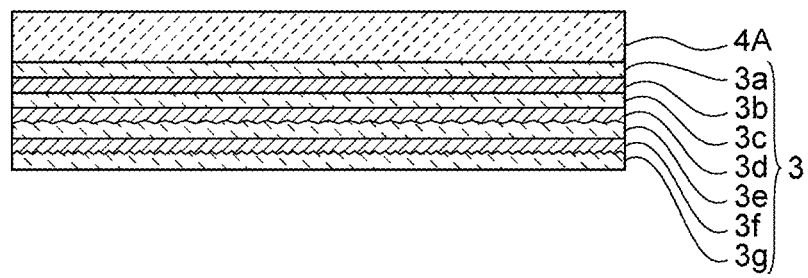

Next, as illustrated in FIG. 20C, the third low acoustic impedance layer 3e and a third high acoustic impedance layer are stacked on the second high acoustic impedance layer 3d. Next, as with the second high acoustic impedance layer 3d, surface roughening is performed on the stacked third high acoustic impedance layer, and the third high acoustic impedance layer 3f is obtained. Note that the surface roughening is performed such that the arithmetic average roughness (Ra) of the third high acoustic impedance layer 3f becomes larger than the arithmetic average roughness (Ra) of the second high acoustic impedance layer 3d.

Next, the fourth low acoustic impedance layer 3g is stacked on the third high acoustic impedance layer 3f. According to this, the acoustic reflection film 3 is obtained.

Figure 20D:
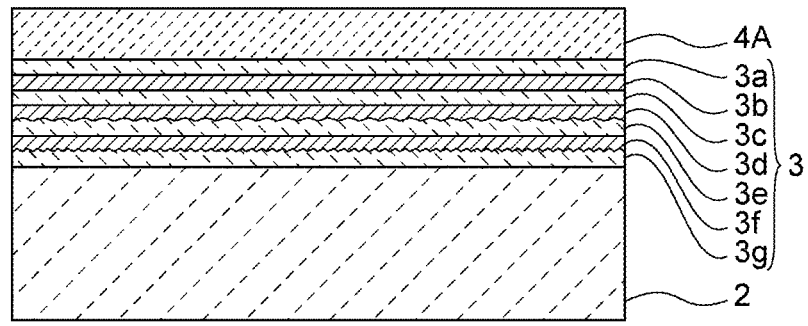

Next, as illustrated in FIG. 20D, the supporting substrate 2 is provided on the fourth low acoustic impedance layer 3g. The supporting substrate 2 may be, for example, joined to the fourth low acoustic impedance layer 3g using adhesive or the like.

Next, the piezoelectric substrate 4A is thinned, for example, by polishing. According to this, as illustrated in FIG. 21A, the piezoelectric thin film 4 is obtained. Depending on the application, the film thickness of the piezoelectric thin film 4 is adjusted by the thinning. Note that making the film thickness equal to about 1 μm or less enables suitable excitement of plate waves.

Next, as illustrated in FIG. 21B, the interdigital transducer electrode 5 and the wiring 6 are formed on a surface of the piezoelectric thin film 4 on the side opposite to the acoustic reflection film 3 side. The interdigital transducer electrode 5 and the wiring 6 may be formed, for example, by lift-off method or the like.

Note that, in the case where an acoustic wave device of the fourth preferred embodiment illustrated in FIG. 19 is fabricated, each of the acoustic impedance layers of the acoustic reflection film 33 may be formed by, for example, patterning using a photolithography method and the like, and then the supporting member 37 may be provided to surround the acoustic reflection film 33. The supporting member 37 may be provided, for example, by sputtering or the like. In this case, the overlapping area of the acoustic reflection film 33 and the wiring 6 in plan view may be reduced. This enables the reduction or prevention of parasitic capacitance.

Figure 23:
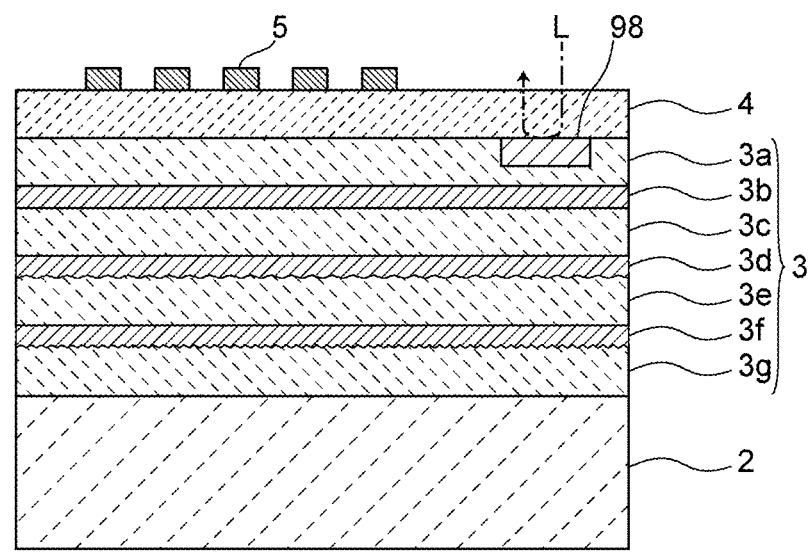
FIG. 23 is a schematic elevational cross-sectional view of an acoustic wave device according to a fifth preferred embodiment of the present invention.
Figure 24:
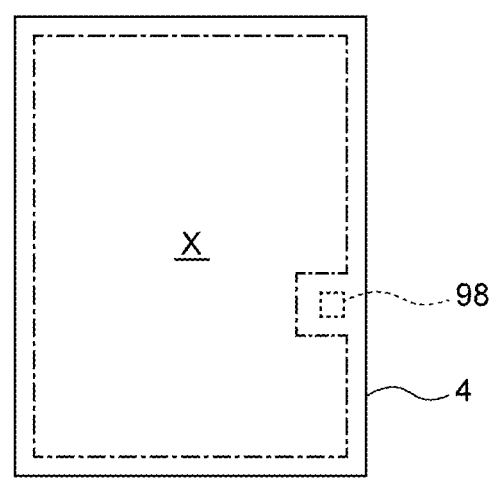
FIG. 24 is a schematic plan view of an acoustic wave device according to the fifth preferred embodiment of the present invention.

FIG. 23 is a schematic elevational cross-sectional view of an acoustic wave device according to a fifth preferred embodiment of the present invention. FIG. 24 is a schematic plan view of the acoustic wave device according to the fifth preferred embodiment. An area X surrounded by the dashed-dotted line in FIG. 24 is an area where the interdigital transducer electrode, the wiring, and the like are provided.

As illustrated in FIG. 23, the present preferred embodiment is different from the first preferred embodiment in that a metal film 98 is provided on a surface on the acoustic reflection film 3 side of the piezoelectric thin film 4. With regard to points other than the above, the acoustic wave device of the present preferred embodiment has a configuration similar to that in the first preferred embodiment. Note that the cross section illustrated in FIG. 23 corresponds to the cross section of the portion that is different from the cross section illustrated in FIG. 1.

Even in the present preferred embodiment, the piezoelectric thin film 4 is provided on the acoustic reflection film 3 similar to that of the first preferred embodiment. Accordingly, the unwanted waves are able to be effectively reduced or prevented.

The metal film 98 is covered by the acoustic impedance layer of the acoustic reflection film 3 positioned closest to the piezoelectric thin film 4. More specifically, the metal film 98 is covered by the first low acoustic impedance layer 3a made of a dielectric. As illustrated in FIG. 24, the metal film 98 is provided at a position where the metal film 98 does not overlap the interdigital transducer electrode in plan view. This enables measurement of the film thickness of the piezoelectric thin film 4 easily with high accuracy. This is described below by comparing the present preferred embodiment with an eighth comparison example.

Note that the eighth comparison example is different from the present preferred embodiment in that the arithmetic average roughnesses (Ra) of all the acoustic impedance layers are 0 nm and the metal film is not provided therein.

Figure 25:
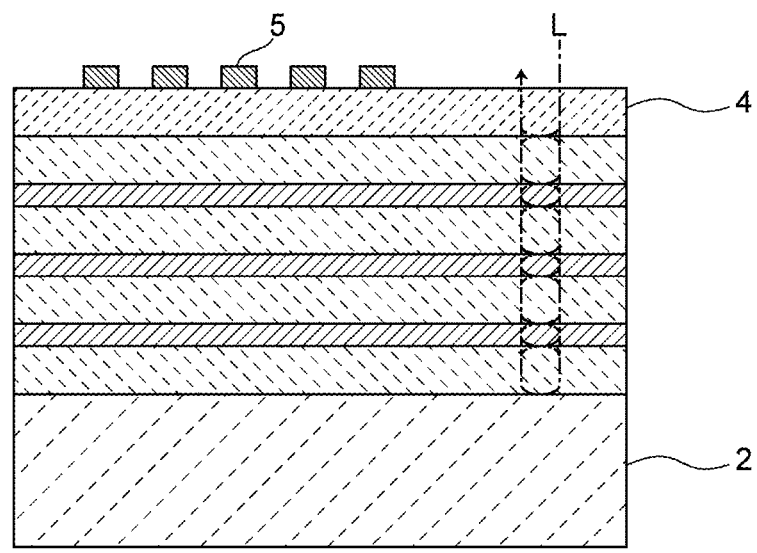
FIG. 25 is a schematic cross-sectional view illustrating part of an acoustic wave device according to an eighth comparison example, which corresponds to the cross section illustrated in FIG. 23.

FIG. 25 is a schematic cross-sectional view illustrating the portion of an acoustic wave device according to the eighth comparison example, which corresponds to the cross section illustrated in FIG. 23.

The measurement of the film thickness is performed, for example, by illuminating an object with light and measuring the intensity of reflected light or by using a similar method. As illustrated in FIG. 25, in the case where each of the acoustic impedance layers of the acoustic reflection film is made of a dielectric, a measurement light L is partially reflected at and partially passes through each boundary between the acoustic impedance layers. In this way, a reflection path of the measurement light L becomes complex. Accordingly, the measurement tends to take more time, and accuracy of the measurement tends to degrade.

On the other hand, as illustrated in FIG. 23, in the present preferred embodiment, the metal film 98 is provided on the surface on the acoustic reflection film 3 side of the piezoelectric thin film 4. Accordingly, even in the case where each of the acoustic impedance layers of the acoustic reflection film 3 is made of a dielectric, the metal film 98 suitably reflects the measurement light L passed through the piezoelectric thin film 4. Accordingly, the film thickness of the piezoelectric thin film 4 is able to be measured easily with high accuracy.

In addition, in the present preferred embodiment, in plan view, the metal film 98 is provided at a position where the metal film 98 does not overlap an area where the interdigital transducer electrode 5 or the wiring is provided. Accordingly, even after the formation of the interdigital transducer electrode 5 or the wiring, the film thickness of the piezoelectric thin film 4 is able to be measured easily with high accuracy. The film thickness of the piezoelectric thin film 4 is able to be measured even after the measurement of electrical characteristics of the interdigital transducer electrode 5 and the like. Note that, in plan view, the metal film 98 may alternatively overlap an area where the interdigital transducer electrode 5 or the wiring is provided. In this case, for example, when fabricating, the film thickness of the piezoelectric thin film 4 may be measured before the formation of the interdigital transducer electrode 5 or the wiring.

The metal film 98 is preferably, for example, a multilayer metal film including a Ti layer, an AlCu layer, and a Ti layer that are stacked in this order from the piezoelectric thin film 4 side. From the piezoelectric thin film 4 side, for example, the film thickness of the Ti layer is preferably about 10 nm, the film thickness of the AlCu layer is preferably about 60 nm, and the film thickness of the Ti layer is preferably about 10 nm. The shape of the metal film 98 in plan view is preferably about 100 μm square. Note that the material, the film thickness, and the shape of the metal film 98 are not limited to the above.

The metal film 98 may alternatively be a single layer metal film.

The metal film 98 preferably includes at least one of Ti and Cr, for example. In this case, adhesion between the metal film 98 and the piezoelectric thin film 4 and between the metal film 98 and the acoustic reflection film 3 is improved. Accordingly, the piezoelectric thin film 4 and the acoustic reflection film 3 are difficult to remove from each other.

Figure 26:
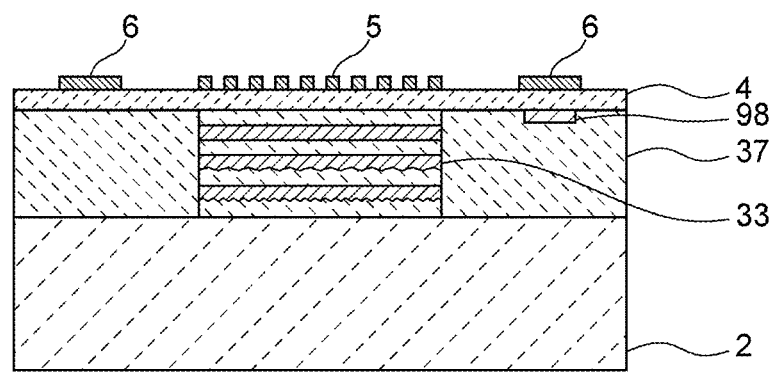
FIG. 26 is a schematic elevational cross-sectional view of an acoustic wave device according to a modified example of the fifth preferred embodiment of the present invention.

Note that, in order to obtain the advantageous effects of the present preferred embodiment, it is only necessary to cover the metal film 98 with a member made of a dielectric. For example, as with the fourth preferred embodiment, in the modified example of the present preferred embodiment illustrated in FIG. 26, the supporting member 37 surrounds the acoustic reflection film 33. The metal film 98 is covered by the supporting member 37 made of a dielectric. As described above, in plan view, the metal film 98 may overlap the area where the interdigital transducer electrode 5 or the wiring 6 is provided.

However, as in the present preferred embodiment illustrated in FIG. 23, in the case where there are many interlayer boundaries, the configuration in which the metal film 98 is provided is particularly suitable.

When fabricating acoustic wave devices, a plurality of electrode structures may be formed on a multilayer body of a motherboard including a piezoelectric thin film of the motherboard. Subsequently, the multilayer body of the motherboard may be cut into individual pieces to obtain a plurality of acoustic wave devices. Here, it is preferable that the metal film 98 is provided in all of the acoustic wave devices. The film thickness of the piezoelectric thin film of the motherboard is not necessarily constant at all positions. Providing the metal film 98 in all of the acoustic wave devices further ensures the measurement of the film thickness of the piezoelectric thin film 4 in all of the acoustic wave devices.

The process of cutting into individual pieces may be performed, for example, by cutting with a dicing machine or the like. In this case, the metal film 98 may be provided on a position where the metal film 98 overlaps a dicing line in plan view. The metal film 98 may be removed by cutting with a dicing machine after the measurement of the film thickness of the piezoelectric thin film of the motherboard. This enables easy measurement of the film thickness of the piezoelectric thin film 4 with high accuracy and further enables downsizing of the acoustic wave device. Note that, in this case, it is preferable that the shape of the metal film 98 is a shape that facilitates removal of the metal film 98 by cutting with a dicing machine. For example, the shape of the metal film 98 in plan view may preferably be about 30 μm square.

The metal film 98 is preferably provided in a position where the metal film 98 overlaps a dicing line in plan view and is adjacent to a portion corresponding to each acoustic wave device to be obtained after cutting into individual pieces. This enables easy measurement of the film thickness of the piezoelectric thin film 4 with high accuracy in all of the acoustic wave devices and further enables downsizing of the acoustic wave device.

The acoustic wave device according to each of the foregoing preferred embodiments may be used as a duplexer of a high frequency front-end circuit or the like. An example of this is described below.

Figure 22:
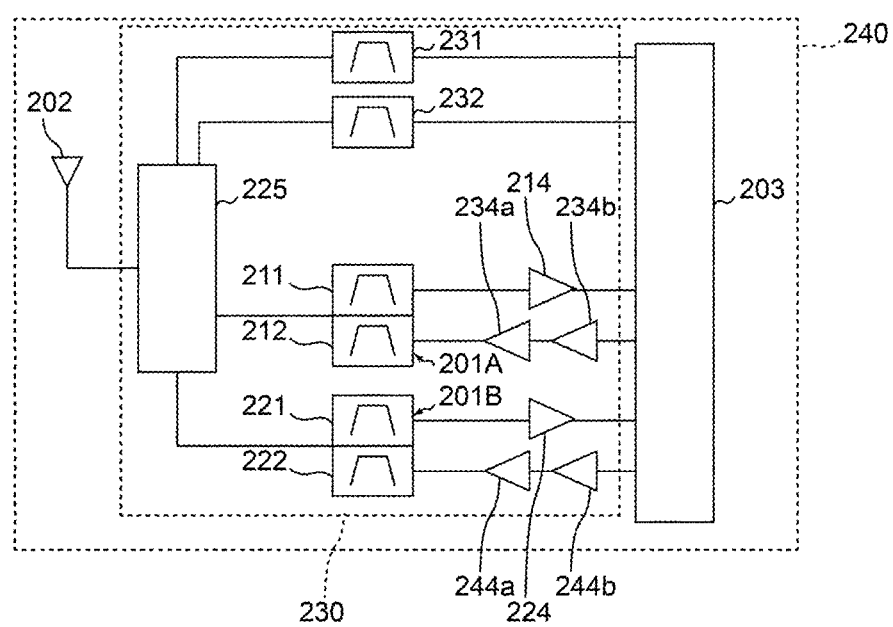
FIG. 22 is a configuration diagram of a communication device including a high frequency front-end circuit.

FIG. 22 is a configuration diagram of a communication device and a high frequency front-end circuit according to a preferred embodiment of the present invention. Note that, in FIG. 22, elements connected to a high frequency front-end circuit 230 such as, for example, an antenna element 202 and a RF signal processing circuit (RFIC) 203 are also illustrated. The high frequency front-end circuit 230 and the RF signal processing circuit (RFIC) 203 define a communication device 240. Note that the communication device 240 may further include a power supply, a CPU, and a display, for example.

The high frequency front-end circuit 230 includes, a switch 225, duplexers 201A and 201B, filters 231 and 232, low noise amplifier circuits 214 and 224, power amplifier circuits 234a, 234b, 244a, and 244b. Note that the high frequency front-end circuit 230 and the communication device 240 of FIG. 22 are examples of the high frequency front-end circuit and the communication device, and their configurations are not limited to this configuration.

The duplexer 201A includes filters 211 and 212. The duplexer 201B includes filters 221 and 222. The duplexers 201A and 201B are connected to the antenna element 202 via the switch 225. Note that the acoustic wave devices according to the preferred embodiments described above may be the duplexer 201A or 201B or the filter 211, 212, 221, or 222.

Further, the acoustic wave devices according to the preferred embodiments described above are applicable to a multiplexer including three or more filters such as, for example, a triplexer in which three filters use a common antenna terminal, a hexaplexer in which six filters use a common antenna terminal, or the like.

That is, the acoustic wave devices according to the preferred embodiments described above include an acoustic wave resonator, a filter, a duplexer, and a multiplexer including three or more filters. Further, the configuration of the multiplexer is not limited to the configuration in which both a transmission filter and a reception filter are included, but the multiplexer may also have a configuration in which only a transmission filter is included or a configuration in which only a reception filter is included.

The switch 225 connects the antenna element 202 and a signal path associated with a predetermined band in response to a control signal from a controller (not illustrated), and is preferably defined by, for example, a single pole double throw (SPDT) type switch. Note that the number of the signal paths to be connected to the antenna element 202 is not limited to one, and may be two or more. In other words, the high frequency front-end circuit 230 may be compatible with carrier aggregation.

The low noise amplifier circuit 214 is a reception amplifier circuit that amplifies a high frequency signal (here, a received high frequency signal) received via the antenna element 202, the switch 225, and the duplexer 201A and outputs to the RF signal processing circuit 203. The low noise amplifier circuit 224 is a reception amplifier circuit that amplifies a high frequency signal (here, a received high frequency signal) received via the antenna element 202, the switch 225, and the duplexer 201B and outputs to the RF signal processing circuit 203.

The power amplifier circuits 234a and 234b are each a transmission amplifier circuit that amplifies a high frequency signal (here, a transmitting high frequency signal) output from the RF signal processing circuit 203 and outputs to the antenna element 202 via the duplexer 201A and the switch 225. The power amplifier circuits 244a and 244b are each a transmission amplifier circuit that amplifies a high frequency signal (here, a transmitting high frequency signal) output from the RF signal processing circuit 203 and outputs to the antenna element 202 via the duplexer 201B and the switch 225.

The RF signal processing circuit 203 performs signal processing using down-converting or the like on a received high frequency signal input from the antenna element 202 via a received signal path and outputs a received signal generated by the signal processing. Further, the RF signal processing circuit 203 performs signal processing using up-converting or the like on an input transmitting signal and outputs a transmitting high frequency signal generated by the signal processing to the power amplifier circuits 234b and 244b. The RF signal processing circuit 203 is preferably, for example, a RFIC. Note that the communication device may include a base band (BB) IC. In this case, the BBIC performs signal processing on the received signal processed in the RFIC. Further, the BBIC performs signal processing on the transmitting signal and outputs to the RFIC. The received signal processed in the BBIC and the transmitting signal before the signal processing in the BBIC may each preferably be, for example, an image signal or a sound signal.

Note that, instead of the duplexers 201A and 201B, the high frequency front-end circuit 230 may include duplexers according to a modified example of the duplexers 201A and 201B.

The filters 231 and 232 in the communication device 240 are connected between the RF signal processing circuit 203 and the switch 225 without involving the low noise amplifier circuits 214 and 224 and the power amplifier circuits 234a, 234b, 244a and 244b. As with the duplexers 201A and 201B, the filters 231 and 232 are connected to the antenna element 202 via the switch 225.

With the high frequency front-end circuit 230 and the communication device 240 configured as described above, unwanted waves are able to be effectively reduced or prevented by including an acoustic wave resonator, a filter, a duplexer, a multiplexer including three or more filters, or the like, defined by an acoustic wave device according to a preferred embodiment of the present invention.

The acoustic wave devices, the high frequency front-end circuits, and the communication devices of the present invention are described using the preferred embodiments and their modified examples. However, the present invention includes other preferred embodiments achieved by combining arbitrary elements of the preferred embodiments and their modified examples, modified examples obtained by applying various modifications, which are conceivable to a person skilled in the art without departing the scope of the present invention, to the preferred embodiments, and a variety of equipment including therein the high frequency front-end circuit and the communication device according to preferred embodiments of the present invention.

Preferred embodiments of the present invention may be widely used in communication equipment, such as cellular phones and the like, for example, as a filter, a multiplexer applicable to a multiband system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a supporting substrate;
   an acoustic reflection film provided on the supporting substrate;
   a piezoelectric body provided on the acoustic reflection film; and
   an interdigital transducer electrode provided on the piezoelectric body; wherein the acoustic reflection film is a multilayer body including a plurality of acoustic impedance layers including a low acoustic impedance layer whose acoustic impedance is relatively low and a high acoustic impedance layer whose acoustic impedance is relatively high; and the acoustic reflection film includes a first acoustic impedance layer and a second acoustic impedance layer, the first acoustic impedance layer being one of the plurality of acoustic impedance layers, the second acoustic impedance layer being one of the plurality of acoustic impedance layers and having an arithmetic average roughness different from an arithmetic average roughness of the first acoustic impedance layer.

2. The acoustic wave device according to claim 1, wherein the first acoustic impedance layer is positioned closer to the piezoelectric body than the second acoustic impedance layer; and the arithmetic average roughness of the second acoustic impedance layer is larger than the arithmetic average roughness of the first acoustic impedance layer.

3. The acoustic wave device according to claim 2, wherein the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of low acoustic impedance layers, and in the plurality of the low acoustic impedance layers, the arithmetic average roughness increases as a position of the low acoustic impedance layer is closer to the supporting substrate.

4. The acoustic wave device according to claim 2, wherein the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of high acoustic impedance layers; and in the plurality of the high acoustic impedance layers, the arithmetic average roughness increases as a position of the high acoustic impedance layer is closer to the supporting substrate.

5. The acoustic wave device according to claim 1, wherein the first acoustic impedance layer is positioned closer to the piezoelectric body than the second acoustic impedance layer; and the arithmetic average roughness of the first acoustic impedance layer is larger than the arithmetic average roughness of the second acoustic impedance layer.

6. The acoustic wave device according to claim 5, wherein the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of low acoustic impedance layers; and in the plurality of the low acoustic impedance layers, the arithmetic average roughness increases as a position of the low acoustic impedance layer is closer to the piezoelectric body.

7. The acoustic wave device according to claim 5, wherein the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of high acoustic impedance layers; and in the plurality of the high acoustic impedance layers, the arithmetic average roughness increases as a position of the high acoustic impedance layer is closer to the piezoelectric body.

8. The acoustic wave device according to claim 1, wherein in the acoustic reflection film, a total of five or more layers including one or more of the low acoustic impedance layer and one or more of the high acoustic impedance layer are stacked on top of one another in an alternating arrangement.

9. The acoustic wave device according to claim 1, wherein a metal film is provided on a surface on an acoustic reflection film side of the piezoelectric body; and the metal film is surrounded by a dielectric member.

10. The acoustic wave device according to claim 9, wherein the dielectric member is the acoustic impedance layer of the acoustic reflection film positioned closest to the piezoelectric body.

11. The acoustic wave device according to claim 9, wherein in plan view, the metal film is provided at a position where the metal film does not overlap the interdigital transducer electrode.

12. The acoustic wave device according to claim 9, wherein the metal film includes at least one of Ti and Cr.

13. The acoustic wave device according to claim 1, wherein a plate wave is used.

14. The acoustic wave device according to claim 1, wherein a film thickness of the piezoelectric body is about 1 μm or less.

15. A high frequency front-end circuit comprising:
the acoustic wave device according to claim 1; and
a power amplifier.

16. The high frequency front-end circuit according to claim 15, wherein
the first acoustic impedance layer is positioned closer to the piezoelectric body than the second acoustic impedance layer; and the arithmetic average roughness of the second acoustic impedance layer is larger than the arithmetic average roughness of the first acoustic impedance layer.

17. The high frequency front-end circuit according to claim 16, wherein
the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of low acoustic impedance layers, and in the plurality of the low acoustic impedance layers, the arithmetic average roughness increases as a position of the low acoustic impedance layer is closer to the supporting substrate.

18. The high frequency front-end circuit according to claim 16, wherein
the acoustic reflection film includes a plurality of the low acoustic impedance layers and a plurality of the high acoustic impedance layers that are stacked on top of one another in an alternating arrangement;

the first acoustic impedance layer and the second acoustic impedance layer are each defined by one of the plurality of high acoustic impedance layers; and in the plurality of the high acoustic impedance layers, the arithmetic average roughness increases as a position of the high acoustic impedance layer is closer to the supporting substrate.

19. The high frequency front-end circuit according to claim 15, wherein
the first acoustic impedance layer is positioned closer to the piezoelectric body than the second acoustic impedance layer; and
the arithmetic average roughness of the first acoustic impedance layer is larger than the arithmetic average roughness of the second acoustic impedance layer.

20. A communication device comprising:
the high frequency front-end circuit according to claim 15; and
a RF signal processing circuit.

* * * * *